(12) United States Patent
Yamaguchi et al.

(10) Patent No.: US 6,376,811 B2
(45) Date of Patent: Apr. 23, 2002

(54) HEATING APPARATUS

(75) Inventors: Shinji Yamaguchi, Aichi Pref.; Atsuo Yamada, Yokohama., both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/773,235

(22) Filed: Jan. 31, 2001

(30) Foreign Application Priority Data

Feb. 3, 2000 (JP) .................................... 2000-026582

(51) Int. Cl.⁷ ................................................ H05B 3/68
(52) U.S. Cl. ............................ 219/468.1; 219/444.1; 219/544
(58) Field of Search .......................... 219/544, 444.1, 219/468.1, 216, 390, 537, 458.1, 416, 543, 553; 338/34; 392/433, 416, 404; 428/138

(56) References Cited

U.S. PATENT DOCUMENTS

| | | | |
|---|---|---|---|
| 4,449,039 A | * 5/1984 | Fukazawa et al. | 219/553 |
| 4,697,165 A | * 9/1987 | Ishiguro et al. | 338/34 |
| 4,912,304 A | * 3/1990 | Philippbar | 219/543 |
| 5,225,663 A | 7/1993 | Matsumura et al. | |
| 5,331,134 A | 7/1994 | Kimura | |
| 5,408,574 A | * 4/1995 | Deevi et al. | 392/404 |
| 5,490,228 A | * 2/1996 | Soma et al. | 392/416 |
| 5,573,690 A | * 11/1996 | Nobori et al. | 219/458.1 |
| 5,683,606 A | * 11/1997 | Ushikoshi et al. | 219/544 |
| 5,756,971 A | * 5/1998 | Hipp | 219/537 |
| 5,940,579 A | * 8/1999 | Kallgren et al. | 392/433 |
| 6,051,303 A | * 4/2000 | Katsuda et al. | 428/138 |
| 6,084,220 A | * 7/2000 | Suematsu et al. | 219/544 |
| 6,172,337 B1 | * 1/2001 | Johnsgard et al. | 219/390 |
| 6,204,489 B1 | * 3/2001 | Katsuda et al. | 219/544 |
| 6,222,158 B1 | * 4/2001 | Nakata et al. | 219/216 |
| 6,225,606 B1 | * 5/2001 | Tsuruta et al. | 219/444.1 |

FOREIGN PATENT DOCUMENTS

| | | | |
|---|---|---|---|
| JP | 5-326112 | 12/1993 | |
| JP | 6196253 | * 7/1994 | H05B/3/18 |

OTHER PUBLICATIONS

Patent Abstracts of Japan, vol. 1999, No. 08, Jun. 30, 1999 & JP 11 084939 A (Canon Inc), Mar. 30, 1999.

* cited by examiner

Primary Examiner—Teresa Walberg
Assistant Examiner—Leonid M Fastovsky
(74) Attorney, Agent, or Firm—Burr & Brown

(57) ABSTRACT

A heating apparatus 1 for preventing increase of the temperature difference on the heating surfaces and occurrence of heat spots in a broad temperature range including a high temperature region includes a substrate 2 made of a ceramic material with a heating surface 2A, a plurality of resistance-heating elements 3 and 4 buried in said substance 2, pairs of terminals 5 and 6, each pair of the terminals 6 and 5 being attached to a respective one of the resistance-heating elements to supply alternating current there to, and AC power sources 11A and 11B each connected to respective one of said pairs of the terminals 6 and 5 for the respective resistance-heating elements to supply the alternating current thereto. Insulating transformers 10A and 10B each are interposed between the respective AC power source and the pair of the terminals.

12 Claims, 3 Drawing Sheets

(1 of 3 Drawing Sheet(s) Filed in Color)

HEATING APPARATUS

BACKGROUND OF THE INVENTION

1. Field of the Invention

The invention relates to a heating apparatus using a ceramic heater.

2. Description of the Related Art

The semiconductor-producing apparatus is equipped with a ceramic heater to heat wafers, which are substrates, for manufacturing semiconductor films from raw material gases such as silane gas by thermal CVD or the like.

The configuration so-called a dual zone heater is known as a ceramic heater. For the dual zone heater, an inner resistance-heating element and an outer resistance-heating element comprising a high-melting point metal such as molybdenum are buried in a ceramic substrate. Separate current-introducing terminals are connected to the respective resistance-heating elements, and the inner resistance-heating element and the outer heating element are independently controlled by applying a predetermined voltage to each resistance-heating element.

Further, JP-5-326112,A discloses that resistance-heating elements of a ceramic heater are constituted of circuit patterns comprising a plurality of high-melting point metals or the like, wherein the circuit patterns are arranged to compensate their deficient areas with each other. Specifically, one circuit pattern overlaps the deficient areas such as fold or turnover portion of other circuit pattern.

Particularly for an application to heating semiconductor wafers, controlling the temperature throughout the heating surface uniformly is necessary, and satisfying strict specifications such as temperature differences being within ±5° C. throughout the heating surface under a use condition is required. A ceramic heater of dual zone controlling system can usually satisfy such specifications. However, the inventors further studied and found that even the ceramic heater, which kept the temperature uniformly within a range from room temperature to 500° C. throughout the heating surface, suddenly caused large temperature differences on the heating surface in a temperature range of, for example, 600° C. or higher. In such a case, heat spots usually occurred at particular parts on a peripheral portion of a substrate of the heater. At the same time, the resistance of the whole length of the resistance heater element tended to decrease, rather than to increase, as shown in, for example, FIG. 2.

It is an object of the invention to prevent increase of the temperature difference on the heating surfaces and occurrence of heat spots in a broad temperature range including a high temperature region in a heating apparatus comprising a substrate made of a ceramic material with a heating surface, a plurality of resistance-heating elements buried in said substance, pairs of terminals, each pair of the terminals being attached to a respective one of the resistance-heating elements to supply alternating current there to, AC power sources each connected to respective one of said pairs of the terminals for the respective resistance-heating elements to supply the alternating current thereto.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

SUMMARY OF THE INVENTION

The present invention relates to a heating apparatus comprising a substrate made of a ceramic material with a heating surface, a plurality of resistance-heating elements buried in said substrate, pairs of terminals, each pair of the terminals being attached to a respective one of the resistance-heating elements to supply alternating current thereto, AC power sources each connected to a respective one of said pairs of the terminals for the respective resistance-heating elements to supply the alternating current thereto, and insulating transformers each interposed between the respective AC power source and the pair of the terminals.

Figure 2:
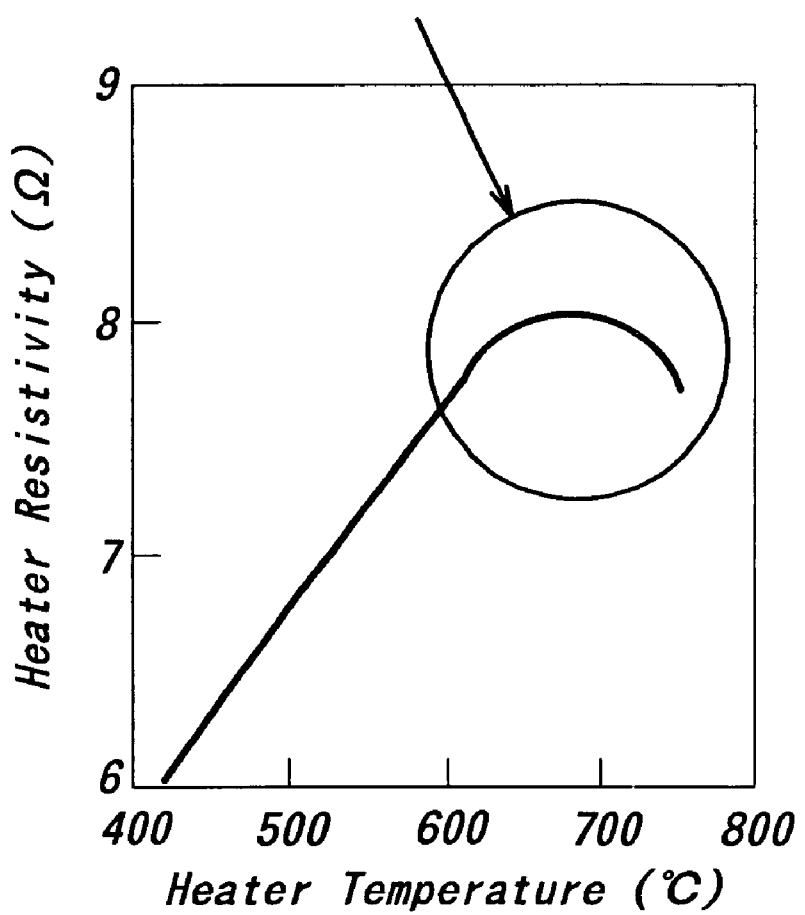
FIG. 2 is a graph, showing changes in resistance of a resistance-heating element 4 when the average temperature of a heating surface was varied within a range of about 400–750° C.
Figure 3:
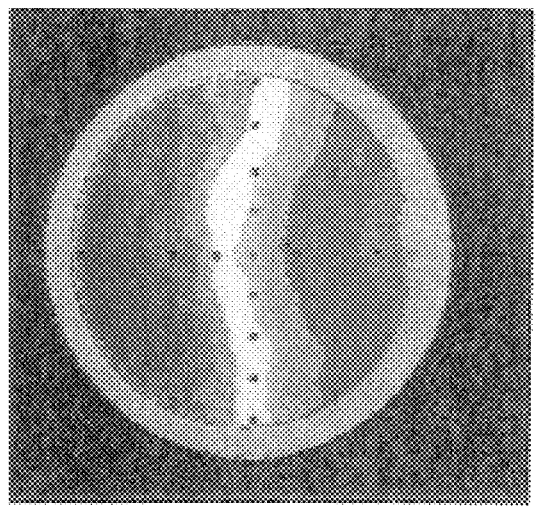
FIG. 3 is a measured result of the thermal distribution of a heating surface of a heating apparatus according to Comparative Example as measured by a thermoviewer.

The inventors investigated the cause of increased temperature variations and occurrence of heat spots on the heating surfaces of such a heating apparatus in a high temperature range. Firstly, from the observation of the beat spots (as shown in FIG. 3, for example), the inventors considered that two-dimensional pattern of the heat spots might possibly have occurred along a direction (a circumferential direction) in which the resistance-heating elements were buried. Further, the inventors noticed that the resistance (whole-length resistance) of the resistance-heating element tended to decrease in the high temperature range as shown in FIG. 2. Since the volume resistivity of a metal generally increases along with temperature rise, the resistance decrease shown in FIG. 2 is considered to be caused not by the change of the material etc. of the resistance-heating element, but by the ceramics.

In the view of this, the inventors further investigated to reach an idea that a leakage current flow through the ceramics between adjacent regions of each resistance-heating elements when the temperature excess a certain level. Especially in the case of the ceramics having a negative thermal coefficient, the leakage current can easily flow. When the leakage current flows, the current in the resistance-heating element increases locally to rise the heat generation, thus the leakage current tends to be further increased more. It is considered that the leakage current is amplified to generate the heat spots in such a process.

Figure 4:
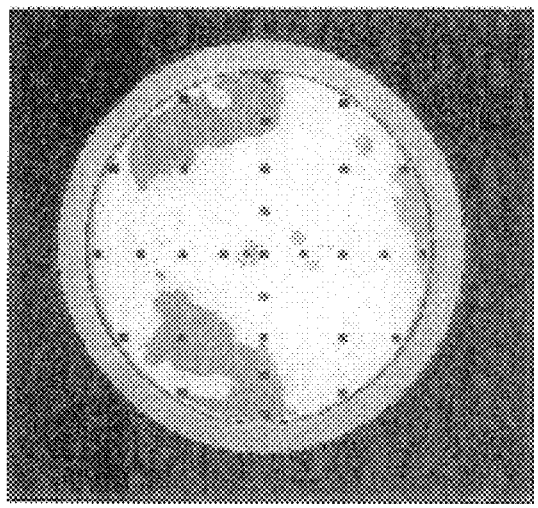
FIG. 4 is a measured result of the thermal distribution of a heating surface of a heating apparatus according to Invention Example as measured by a thermoviewer.

Based on this assumption, insulating transformers are each interposed between the resistance-heating element and the power source, to isolate the current flowing one resistance-heating element from that flowing the other. That is, the insulating transformers are independently constitutes closed circuits, so that the current flowing one insulating transformer flows the corresponding closed circuit, but does not leaks therefrom or receive a leak current from other circuit unlike an open circuit. As the result, the heat spots are nearly solved and the temperature differences on the heating surface is remarkably reduced, for example, as shown in FIG. 4.

Although the kinds of ceramics are not limited, aluminum nitride, silicon nitride and boron nitride are preferably used in the view of the temperature coefficient of the volume resistivity being negative and its absolute value being large, and aluminum nitride is more preferably used in the view of corrosion resistance.

The invention is particularly useful when the temperature coefficient of the volume resistivity of the material of the resistance-heating element is positive. Preferably, high-melting point metals such as tantalum, tungsten, molybdenum, platinum, rhenium, hafnium and alloys thereof are used as specific materials of the resistance-heating element. Especially, when the ceramic substrate is composed of aluminum nitride, molybdenum and a molybdenum alloy are preferably used. Conductive materials such as carbon, TiN and TiC can be also used other besides high-melting point metals.

The resistance-heating elements preferably comprise a plurality of planar resistance-heating elements provided in the form of layers as viewed in a thickness direction of the substrate, wherein each planar resistance-heating elements have heat-generating density increased portions in mutually different locations or in a partially overlapped relation as viewed in a plane. More preferably, the planar resistance-heating elements are arranged in nearly parallel to the heating surface of the substrate. These embodiments will be explained in more detail with reference to FIG. 1.

Figure 1:
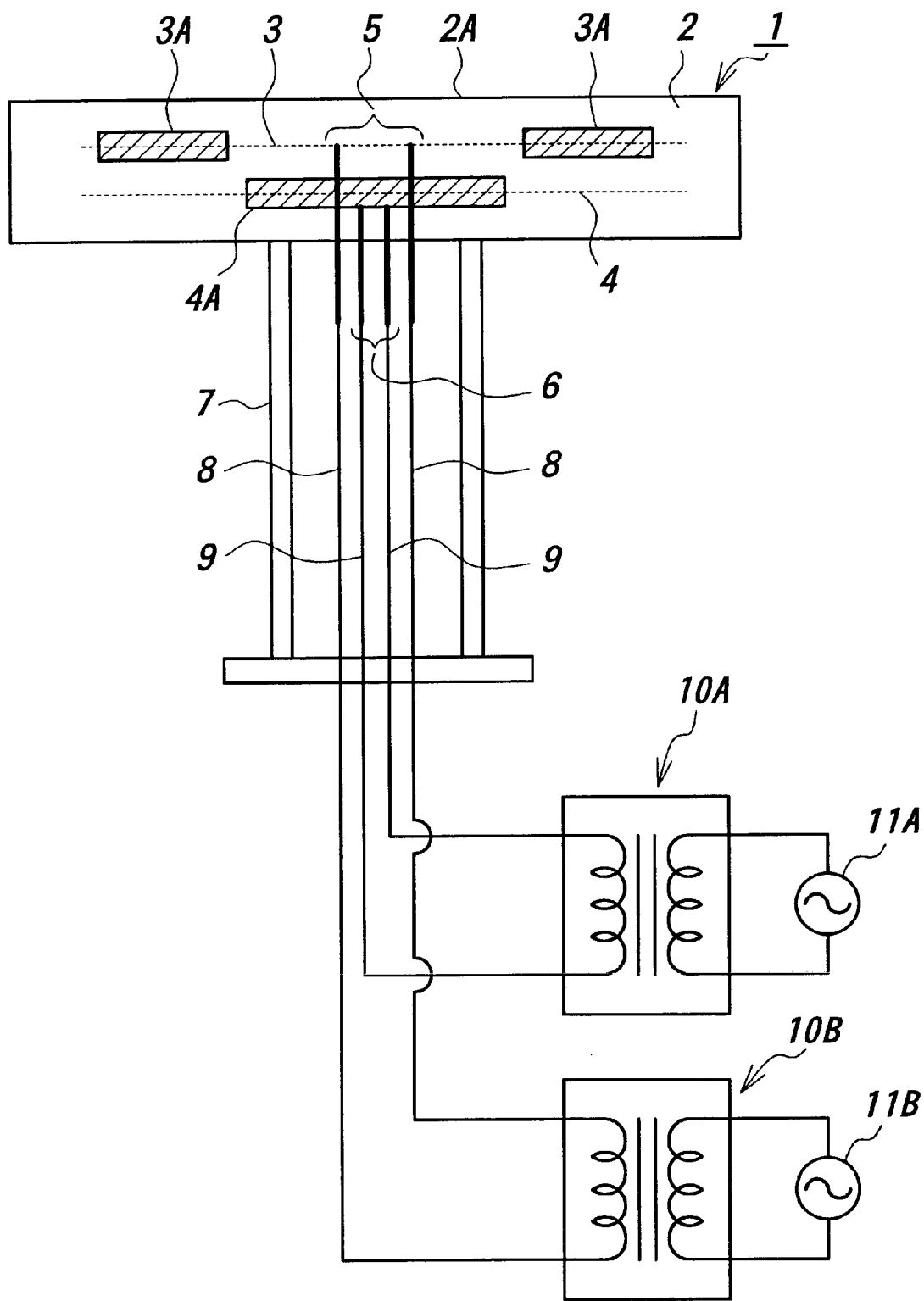
FIG. 1 is a schematic view of a heating apparatus according to an embodiment of the invention.

FIG. 1 is a schematic view of a heating apparatus according to an embodiment of the invention. For the expedience of an explanation, the details of the apparatus are simplified and sizes of each part of the apparatus are drawn with a scale different from those of the actual heating apparatus.

A ceramic heater 1 comprises a substrate 2, an upper planar resistance-heating element 3 and a lower planar resistance-heating element 4 both of which are buried in the substrate 2. Current-introducing terminals 5 and 6 are provided, for example, in a center of the substrate 2.

The resistance-heating elements 3 and 4 are buried nearly in parallel to a heating surface 2A of the substrate 2. The upper planar resistance-heating element 3 has a heat-generating density increased portion 3A in an outer peripheral region of the substrate 2, and the lower planar resistance-heating element 4 has a heat-generating density increased portion 4A in an inner region of the substrate 2.

One ends of the terminals 5 are connected to the upper planar resistance-heating element 3, and one ends of the terminals 6 connected to the heat-generating density increased portion 4A of the lower planar resistance-heating element 4. The terminals were 4 mm in diameter and 15 mm in length, consisted of Ni and had KOVAR heads which were connected with an Au-Ni brazing material. Lead wires 8 and 9 are connected to the other ends of the terminals 5 and 6, respectively. The lead wires 9 are connected to an AC power source 11A via an insulating transformer 10A. The lead wires 8 are connected to an AC power source 11B via an insulating transformer 10B. Electric power supplied by each AC power source 11A and 11B can be controlled independently.

A cylindrical member 7 is joined on the rear side of the substrate 2, which protects the other ends of the current-introducing terminals 5 and 6, or projecting parts of the terminals out of the substrate 2.

When the resistance of the ceramics decreases in the high temperature region, a leakage current flows, for example, between the heat-generating density increased portion 3A and the heating element 4 to cause a heat spot. The invention can prevent such a leakage current between the resistance-heating elements in the respective layers.

Moreover, the following functions and effects can be acquired by the heating apparatus as shown in FIG. 1. For example, when such a dual zone ceramic heater as shown in FIG. 1 has been operated for a long period, the substrate and each resistance-heating element are frequently heated and cooled. By such heating-cooling cycles, the current-introducing terminals connected to the resistance-heating elements undergo shear stress resulting from the difference in thermal expansion, which is based on difference in the coefficient of thermal expansion between the ceramic constituting the substrate and the high-melting point metal constituting the resistance-heating elements. When such shear stress frequently applies on the terminals, the terminals may be broken by fatigue fracture.

Generally, the resistance-heating elements are joined to the current-introducing terminals by a brazing material. The brazed junction may be possibly broken away by a shear stress resulting from the difference in thermal expansion between the resistance-heating element and the brazing filler metal.

If the current-introducing terminal is separated from a resistance-heating element, no current supplies to the resistance-heating element, thus no heat is generated. Therefore, a large temperature difference may occur in the ceramic substrate to cause cracks in the ceramics.

On the other hand, according to such a heating apparatus as shown in FIG. 1, for example, the planar resistance-heating elements have heat-generating density increased portions in mutually different locations (locations without overlapping) as viewed in a plane, although the heat-generating density increased portions can also be partially overlapped as viewed in a plane. Herewith, the apparatus can perform as a dual zone heater without any problems. The reason is that the supplied power to the resistance-heating element 4 can be increased to enlarge the contribution of the heat-generating density increased portion 4A when the temperature of the inner circumferential side is needed to rise. Further, the supplied power to the resistance-heating element 3 can be increased to enlarge the contribution of the heat-generating density increased portion 3A when the temperature of the outer circumferential side is needed to rise.

At the same time, for example, when the upper planar resistance-heating element 3 stops generating heat, only the lower planar resistance-heating element 4 generates heat. In this case, however, the difference in heating-generated amount between the heat-generating density increased portion 4A and the other parts is smaller than that of conventional dual zone heaters. Therefore, the temperature difference between the outer circumferential side and the inner circumferential side of the substrate is relatively small, thus cracks are difficult to be initiated.

In the ceramic beater as shown in FIG. 1, the upper planar resistance-heating element 3 and lower planar resistance-heating element 4 are arranged to be nearly parallel to the heating surface 2A of the substrate 2. Thereby, vertical heat conduction in the ceramic substrate 2 is performed quite uniformly. Therefore, when an object to be heated, a semiconductor wafer, for example, is laid on the heating surface 2A, the wafer can be heated uniformly and efficiently. Note that "nearly parallel" herein is within a range from −0.5 degree to 0.5 degree, in addition to "geometrically completely parallel."

Moreover, in the ceramic heater according to the invention, when each planar resistance-heating element is heated, temperature variations of the heating surface of the substrate are preferably within 50° C., more preferably within 20° C. Thereby, for example, even when the electric current stops flowing into the upper planar resistance-heating element 3 in FIG. 1 and the upper planar resistance-heating element stops acting as a heating element, since well uniform heating can be achieved by the lower planar resistance-heating element 4 alone, cracks that would be caused by uneven temperature distribution in the substrate can be effectively restrained. Further, the object to be heated on the heating surface 2A can be heated more uniformly.

The shape of the resistance-heating element of the heating apparatus according to the invention is not limited, as far as the object of the invention can be achieved. For example, the resistance-heating element may be constituted from a network member, a coilspring, and a ribbon member or the like. For giving a remarkable resistance to the heating-cooling thermal cycles on operating the ceramic heater, the resistance-heating element may be preferably constituted from the network member or coilspring. Moreover, a planar shape of the resistance-heating element is not particularly limited.

When the planar resistance-heating element is constituted from a network member, the heat density increasing area is formed either by weaving the net in a prescribed part at a high density or by reducing the cross section of a prescribed part of the material constituting the network member. When the planar resistance-heating element is constituted from a coilspring, the heat-generating density increased portion is formed either by increasing the number of turns or pitch at a prescribed part or by enlarging the diameter of concentric turns constituting the coil at a prescribed part. When the planar resistance-heating element is constituted from a ribbon member, the heat-generating density increased portion is formed by reducing the width of the ribbon at a prescribed part.

(EXAMPLE)

A heating apparatus as schematically shown in FIG. 1 was prepared. Specifically, aluminum nitride powder obtained from the reduction nitriding method was used, acrylic binder was added to the powder, and the mixture was granulated by a spray dryer, thereby obtaining the granulated grains. Three molded sheet were sequentially uniaxially pressmolded, thereby laminating and integrating them. Coil-shaped resistance heating elements 3 and 4 made of molybdenum were buried in the uniaxially press-molded body.

The molded body was placed in a hot press mold, which was hermetically sealed. The molded body was heated at a heating rate of 300° C./hour, while the pressure was reduced in a temperature range from the room temperature to 1,000° C. Then, the pressure was increased simultaneously with increase in temperature. The maximum temperature was 1,800° C., and the molded body was held and fired at the maximum temperature under 200 kgf/cm$^2$ for 4 hours in nitrogen gas to obtain a sintered body. Then the sintered body was subjected to a machine work and a finish machining, thereby a heater was prepared. The diameter and the thickness of a substrate 2 were set to 240 mm and 18 mm, respectively, and the thickness of an insulative conductive layer was set to 1 mm. The clearance between the resistance-heating elements 3 and 4 was set to 5.5 mm.

A circuit was formed as schematically shown in FIG. 1 in Invention Example. In Comparative Example, insulating transformers 10A and 10B were not equipped. Instead, lead wires 9 and 8 were directly connected to AC power sources 11A and 11B, respectively.

By controlling power supply from each AC power source, the average temperature of the heating surface of the heating apparatus was varied from about 400 to 700° C. to measure temperature changes in resistance between a pair of terminals 6 of the resistance-heating element 4. A result is shown in FIG. 2.

Moreover, surface temperature distribution of the heating surface at the average temperature of the heating surface being 700° C. was measured by a thermoviewer. A measurement result of Comparative Example is shown in FIG. 3 and a measurement result of Invention Example is shown in FIG. 4. In FIGS. 3 and 4, a warm color region represents a high temperature and a cold color region represents a low temperature. For example, the temperature decreases from red to yellow, green and blue, and a step of color tone corresponds to 2.5° C. In other words, a temperature difference of 2.5° C. corresponds to a change between two adjacent color regions in different tones of a step. Therefore, from the results observed by the thermoviewer, the difference between the highest and the lowest temperatures of the heating surface can be calculated. The calculated result is 26° C. in Comparative Example, and 7.5° C. in Invention Example.

(Effect of the invention)

As mentioned above, according to the invention, increased temperature differences and heat spots on the heating surfaces of the said heating apparatus can be prevented over a broad temperature range including the high temperature region.

What is claimed is:

1. A heating apparatus comprising substrate made of a ceramic material with a heating surface, a plurality of resistance-heating elements buried in said substrate, pairs of terminals, each pair of the terminals being attached to a respective one of the resistance-heating elements to supply alternating current thereto, AC power sources each connected to a respective one of said pairs of terminals for the respective resistance-heating elements to supply the alternating current thereto, and insulating transformers each interposed between the AC power sources and pair of the terminals.

2. A heating apparatus according to claim 1, wherein the temperature coefficient of a volume resistivity of said ceramic material is negative.

3. A heating apparatus according to claim 2, wherein said ceramic comprises aluminum nitride.

4. A heating apparatus according to claims 2 or 3, wherein the temperature coefficient of a volume resistivity of a material constituting said resistance-heating elements is positive.

5. A heating apparatus according to any one of claims 1 to 3, wherein said resistance-heating elements comprise a plurality of planar resistance-heating elements provided in the form of layers as viewed in a thickness direction, preferably said planar resistance-heating elements having respective heat-generating density increased portions in mutually different locations or in a partially overlapped relation as viewed in a plane.

6. A heating apparatus according to claim 4, wherein said resistance-heating elements comprise a plurality of planar resistance-heating elements provided in the form of layers as viewed in a thickness direction, preferably said planar resistance-heating elements having respective heat-generating density increased portions in mutually different locations or in a partially overlapped relation as viewed in a plane.

7. A heating apparatus according to claim 5, wherein said planar resistance-heating elements are arranged in nearly parallel to said heating surface of said substrate.

8. A heating apparatus according to claim 6, wherein said planar resistance-heating elements are arranged in nearly parallel to said heating surface of said substrate.

9. A heating apparatus according to claim 5, wherein temperature variations of said heating surface is within 50° C. when the alternative power is supplied only to any one of a plurality of said planar resistance-heating elements for heating.

10. A heating apparatus according to claim 6, wherein temperature variations of said heating surface is within 50° C. when the alternative power is supplied only to any one of a plurality of said planar resistance-heating elements for heating.

11. A heating apparatus according to claim 7, wherein temperature variations of said heating surface is within 50° C. when the alternative power is supplied only to any one of a plurality of said planar resistance-heating elements for heating.

12. A heating apparatus according to claim 8, wherein temperature variations of said heating surface is within 50° C. when the alternative power is supplied only to any one of a plurality of said planar resistance-heating elements for heating.

* * * * *